US009209063B2

(12) United States Patent
Lee et al.

(10) Patent No.: US 9,209,063 B2
(45) Date of Patent: *Dec. 8, 2015

(54) APPARATUS FOR TRANSFERRING SUBSTRATES

(71) Applicant: TES Co., Ltd., Gyeonggi-do (KR)

(72) Inventors: Soo Jong Lee, Gyeonggi-do (KR); Eun Jae Choi, Gyeonggi-do (KR); Sung Pyo Lee, Gyeonggi-do (KR); Byoung Sam Choi, Gyeonggi-do (KR); Yoon Bum Kim, Seoul (KR); Hyeon Ju Kim, Gyeonggi-do (KR); Jae Wan Park, Gyeonggi-do (KR); Jeong Yong Kim, Gyeonggi-do (KR); Chang Hyun Jee, Seoul (KR); Jae Ok Park, Gyeonggi-do (KR)

(73) Assignee: TES Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,058

(22) Filed: Oct. 20, 2014

(65) Prior Publication Data

US 2015/0050112 A1 Feb. 19, 2015

Related U.S. Application Data

(62) Division of application No. 14/044,192, filed on Oct. 2, 2013, now Pat. No. 9,142,442.

(30) Foreign Application Priority Data

Oct. 11, 2012 (KR) .................. 10-2012-0113222
Mar. 14, 2013 (KR) .................. 10-2013-0027548
Mar. 15, 2013 (KR) .................. 10-2013-0028216

(51) Int. Cl.
*H01L 21/677* (2006.01)
*H01L 21/687* (2006.01)

(52) U.S. Cl.
CPC .... *H01L 21/68707* (2013.01); *H01L 21/67703* (2013.01); *H01L 21/67706* (2013.01); *H01L 21/67742* (2013.01); *H01L 21/67748* (2013.01); *H01L 21/67751* (2013.01)

(58) Field of Classification Search
None
See application file for complete search history.

(56) References Cited

U.S. PATENT DOCUMENTS 6,224,319 B1 * 5/2001 Velikov et al. ............. 414/744.5
2008/0260503 A1 10/2008 Uratani et al.
(Continued)

FOREIGN PATENT DOCUMENTS

JP 09-150392 6/1997
JP 10-296666 11/1998
(Continued)

*Primary Examiner* — Ernesto Suarez
*Assistant Examiner* — Ronald Jarrett
(74) *Attorney, Agent, or Firm* — Husch Blackwell LLP

(57) ABSTRACT

The present invention relates to an apparatus for transferring a substrate. The apparatus includes a supporting member; an elevating and rotating member; a transferring unit; a first arm whose one end is supported by the elevating and rotating member to be rotatable; a second arm whose one end is supported by the transferring unit to be rotatable and whose the other end is supported by the other end of the first arm to be rotatable; and an arm driving part, installed on the first arm, which drives the other end of the second arm to pivot on the other end of the first arm to allow the first arm and the second arm to be folded or unfolded and thus removes the state of singularity by rotating the other end of the second arm based on the other end of the first arm.

4 Claims, 19 Drawing Sheets

(56) References Cited

U.S. PATENT DOCUMENTS

| | | | |
|---|---|---|---|
| 2009/0022571 A1* | 1/2009 | Krupyshev et al. | 414/217 |
| 2010/0116077 A1 | 5/2010 | Shimamoto et al. | |
| 2010/0178135 A1 | 7/2010 | Laceky et al. | |
| 2012/0215358 A1 | 8/2012 | Gettings et al. | |
| 2012/0251287 A1* | 10/2012 | Fujimura et al. | 414/749.1 |

FOREIGN PATENT DOCUMENTS

| | | |
|---|---|---|
| JP | 2003-045934 | 2/2003 |
| JP | 2004-207750 | 7/2004 |
| JP | 2004-535674 | 11/2004 |
| JP | 2005-116665 | 4/2005 |
| JP | 2005-125479 | 5/2005 |
| JP | 2006-510559 A | 3/2006 |
| JP | 2007-118171 | 5/2007 |
| JP | 2007-266221 | 10/2007 |
| JP | 2008-264923 | 11/2008 |
| JP | 2009-088222 | 4/2009 |
| JP | 2009-233824 | 10/2009 |
| JP | 4364001 B2 | 11/2009 |
| JP | 2010-201556 | 9/2010 |
| JP | 2012-035408 | 2/2012 |
| KR | 1020090008400 | 1/2009 |
| KR | 1020120088286 | 8/2012 |
| TW | I259127 | 8/2006 |
| WO | 2008-136292 A1 | 11/2008 |

* cited by examiner

APPARATUS FOR TRANSFERRING SUBSTRATES

CROSS REFERENCE TO RELATED APPLICATIONS

This application is a divisional application of U.S. application Ser. No. 14/044,192 filed on Oct. 2, 2013, said application claims the Convention priority date of Oct. 11, 2012, based on Korean Patent Application No. 10-2012-0113222 and claims the Convention priority date of Mar. 14, 2013, based on Korean Patent Application No. 10-2013-0027548 and claiming the Convention priority date of Mar. 15, 2013, based on Korean Patent Application No. 10-2013-0028216, all incorporated herein by reference.

FIELD OF THE INVENTION

The present invention relates to an apparatus for transferring a substrate.

BACKGROUND OF THE INVENTION

Substrates such as wafers for semiconductor devices and glass substrates for either display units or thin film solar cells are manufactured through several processes. At the time, substrates are loaded to, and processed at, a substrate processing device which provides optimal conditions required for each process.

Today, a cluster-type substrate processing device that may process substrates in batches has been developed and used to improve productivity.

The cluster-type substrate processing device includes a load lock chamber where substrates are stored, a transfer chamber for transferring substrates, and multiple process chambers for performing respective processes. An apparatus for transferring substrates which is installed in the transfer chamber generally at a vacuum state transfers substrates between the load lock chamber and the transfer chamber, or between the transfer chambers.

A substrate apparatus for transporting substrates published in Korea Laid-Open Publication No. 10-2009-0008400 folds or unfolds an articulated arm 31 by using a belt drive system 38 and transfers substrates to be treated while a hand 32 makes a linearly reciprocating motion due to the articulated arm 31. However, because the apparatus for transporting substrates folds or unfolds the articulated arm 31 by using the belt drive system 38, one side of the belt drive system 38 must be necessarily exposed to the outside. This may threaten to cause the substrates to be damaged by particles generated from the belt drive system 38.

A conveyance robot which solves such a problem is disclosed in Japanese Patent No. 4364001.

The conveyance robot is installed to allow an axis 31A formed on one end of a first link arm 31 to be rotatable on a swivel base 300 by a driving unit such as a motor, and the other end of the first link arm 31 is installed to an intermediate link 33 to be rotatable. One end and the other end of a second link arm 34 are installed to a linear motion unit 20 and to the intermediate link 33, respectively, to be rotatable.

As the first link arm 31 is normally or reversely rotated based on the center 01 of the axis 31A, the first link arm 31 and the second link arm 34 are mutually folded or unfolded based on the intermediate link 33 and this causes the linear motion unit 20 to give linear reciprocating motions. The linear motion unit 20 has multiple hands 21 on which works W are loaded and supported.

Since the first link arm 31 of the conveyance robot is rotated based on the axis 31A that is supported by a swivel base 300, when the other end of the first link arm 31 and that of the second link arm 34 are combined together to be rotatable, and the virtual linear line connecting both ends of the first link arm 31 and that connecting both ends of the second link arm 34 are overlapped to become at the state of singularity, the second link arm 34 may also threaten to be rotatable due to the rotation of the first link arm 31. As the first link arm 31 and the second link arm 34, then, cannot be folded or unfolded, the linear motion unit 20 cannot give linear motions.

To prevent this, the other end of the first link arm 31 and that of the second link arm 34 of the conveyance robot are installed to the intermediate link 33 to be rotatable by being made to be mutually separated and one end and the other end of a separate ancillary link arm 32 are installed to the swivel base 300 and the intermediate link 33 to be rotatable.

As shown above, the conventional conveyance robot may increase the costs due to its complicate structure.

SUMMARY OF THE INVENTION

It is an object of the present invention to solve all the problems mentioned above.

It is another object of the present invention to provide an apparatus for transferring substrates that saves costs.

In accordance with one aspect of the present invention, there is provided an apparatus for transferring substrates, including: a supporting member; an elevating and rotating member installed to be elevated or descended and rotated on the upper side of the supporting member; a transferring unit, which is installed on the elevating and rotating member, for making linear motions to transfer substrates when the elevating and rotating member moves; a first arm whose one end is supported by the elevating and rotating member to be rotatable; a second arm whose one end is supported by the transferring unit to be rotatable and whose the other end is supported by the other end of the first arm to be rotatable; and an arm driving part, installed on the first arm, which drives the other end of the second arm to pivot on the other end of the first arm to allow the first arm and the second arm to be folded or unfolded and thus removes the state of singularity by rotating the other end of the second arm based on the other end of the first arm to allow the second arm to be unfolded with the first arm even when the first arm and the second arm are arranged at an overlapped state while the first arm and the second arm move.

In accordance with another aspect of the present invention, there is provided an apparatus for transferring substrates, including: a supporting member; an elevating and rotating member installed to be elevated or descended and rotated on the upper side of the supporting member; a transferring unit, which is installed on the elevating and rotating member, for making linear motions to transfer substrates when the elevating and rotating member moves; a first arm whose one end is supported by the elevating and rotating member to be rotatable; a second arm whose one end is supported by the transferring unit to be rotatable and whose the other end is supported by the other end of the first arm to be rotatable and which is bent; an arm driving part, which is installed on the first arm, drives the other end of the second arm to pivot on the other end of the first arm to allow the first arm and the second arm to be folded or unfolded and thus removes the state of singularity by rotating the other end of the second arm based on the other end of the first arm to allow the second arm to be unfolded with the first arm when a virtual linear line connecting both ends of the first arm and that connecting both ends of the second arm are arranged at an overlapped state while the first arm and the second arm move.

In accordance with still another aspect of the present invention, there is provided an apparatus for transferring substrates, including: a supporting member; an elevating and rotating member installed to be elevated or descended and rotated on the upper side of the supporting member; a transferring unit, which is installed on the elevating and rotating member, for making linear motions to transfer substrates when the elevating and rotating member moves; a first arm whose one end is supported by the elevating and rotating member to be rotatable; a second arm which includes a pair of sub-arms and the respective sub-arms are bent whose one ends are supported by the transferring unit to be rotatable and whose the other ends are supported by the other end of the first arm to be rotatable; and an arm driving part, which is installed on the first arm, drives the other end of the second arm to pivot on the other end of the first arm to allow the first arm and the second arm to be folded or unfolded and thus removes the state of singularity by rotating the other end of the second arm based on the other end of the first arm to allow the second arm to be unfolded with the first arm when a virtual linear line connecting both ends of the first arm and that connecting both ends of the second arm are arranged at an overlapped state while the first arm and the second arm move.

In accordance with still another aspect of the present invention, there is provided an apparatus for transferring substrates, including: a supporting member; an elevating and rotating member installed to be elevated or descended and rotated on the upper side of the supporting member; a transferring unit, which is installed on the elevating and rotating member, for making linear motions to transfer substrates when the elevating and rotating member moves; a first arm whose one end is supported by the elevating and rotating member to be rotatable; a second arm whose one end is supported by the transferring unit to be rotatable and whose the other end is supported by the other end of the first arm to be rotatable; and an arm driving part, which is installed on the first arm, drives the other end of the second arm to pivot on the other end of the first arm to allow the first arm and the second arm to be folded or unfolded and thus removes the state of singularity by rotating the other end of the second arm based on the other end of the first arm to allow the second arm to be unfolded with the first arm when a virtual linear line connecting both ends of the first arm and that connecting both ends of the second arm are arranged at an overlapped state while the first arm and the second arm move, wherein the second arm is formed with a material having a lower thermal expansion coefficient than the first arm.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
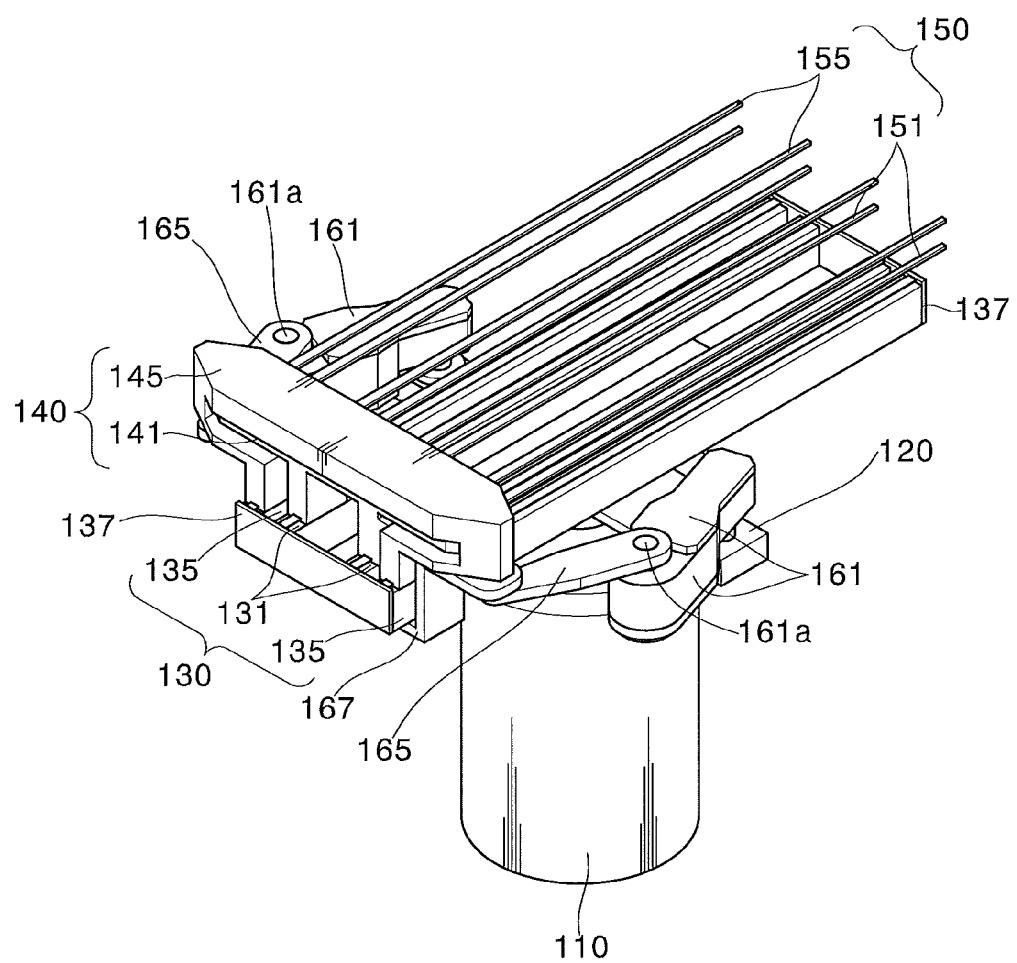
FIG. 1 is a perspective view of an apparatus for transferring substrates in accordance with a first example embodiment of the present invention.

The detailed description of the present invention illustrates specific embodiments in which the present invention can be performed with reference to the attached drawings.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present invention, although different, are not necessarily mutually exclusive. For example, a particular feature, structure, or characteristic described herein in connection with one embodiment may be implemented within other embodiments without departing from the spirit and scope of the present invention. In addition, it is to be understood that the location or arrangement of individual elements within each disclosed embodiment may be modified without departing from the spirit and scope of the present invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The apparatus for transferring substrates in accordance with example embodiments of the present invention will be explained by referring to attached diagrams in detail as follows:

First Example Embodiment

Figure 2:
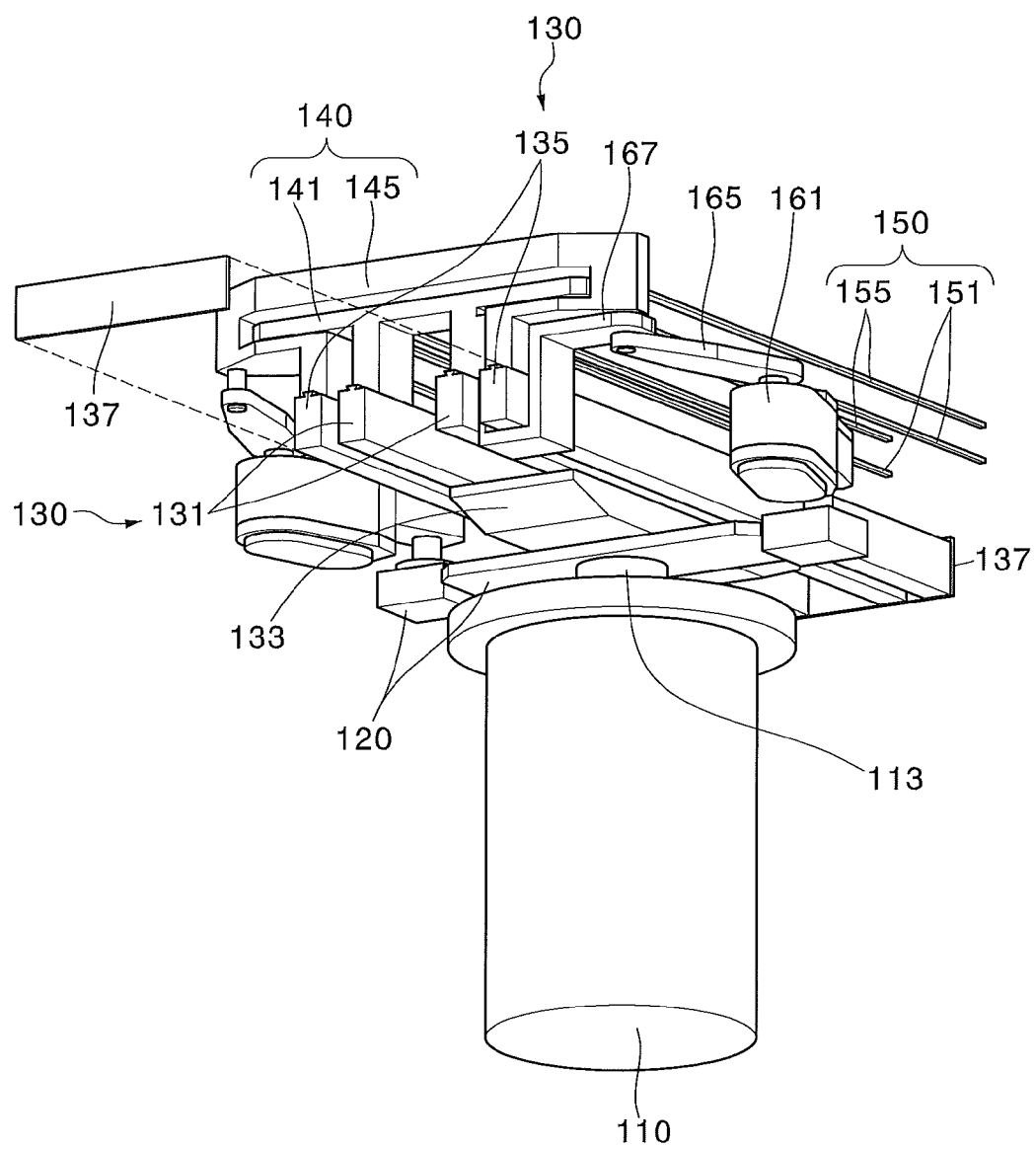
FIG. 2 is an exploded perspective view showing the bottom of FIG. 1.
Figure 3A:
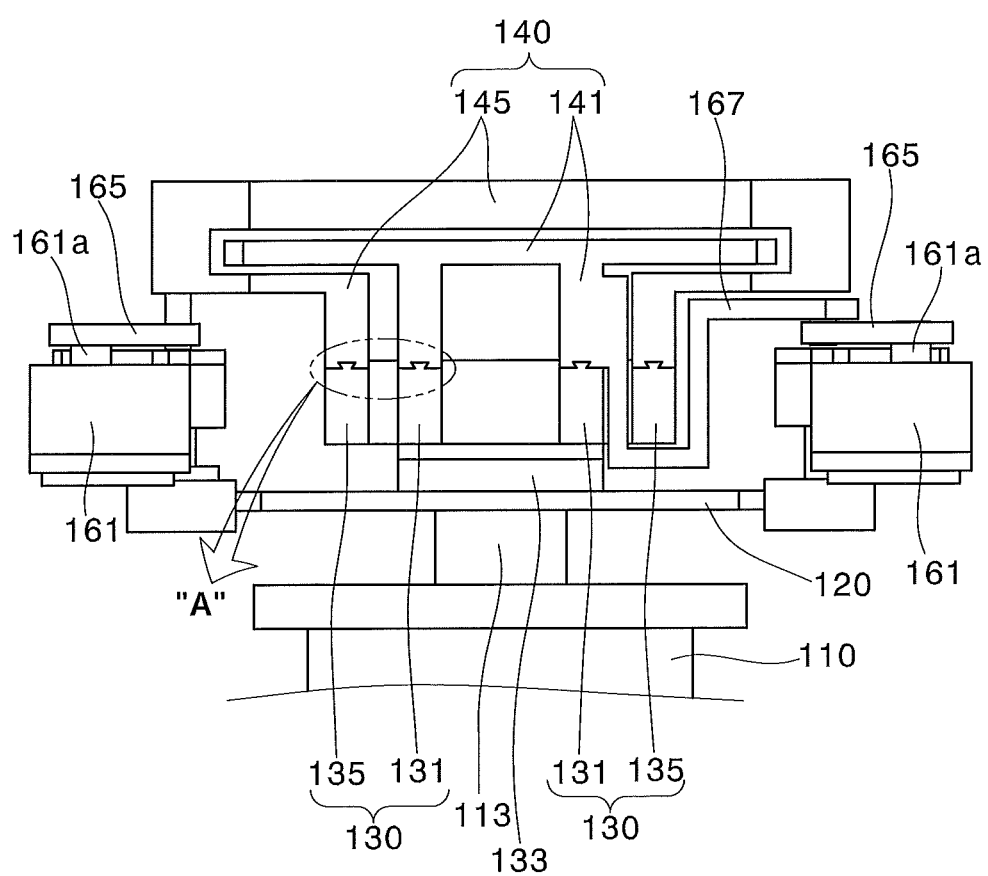
FIG. 3A is a diagram showing the left of FIG. 2.
Figure 3B:
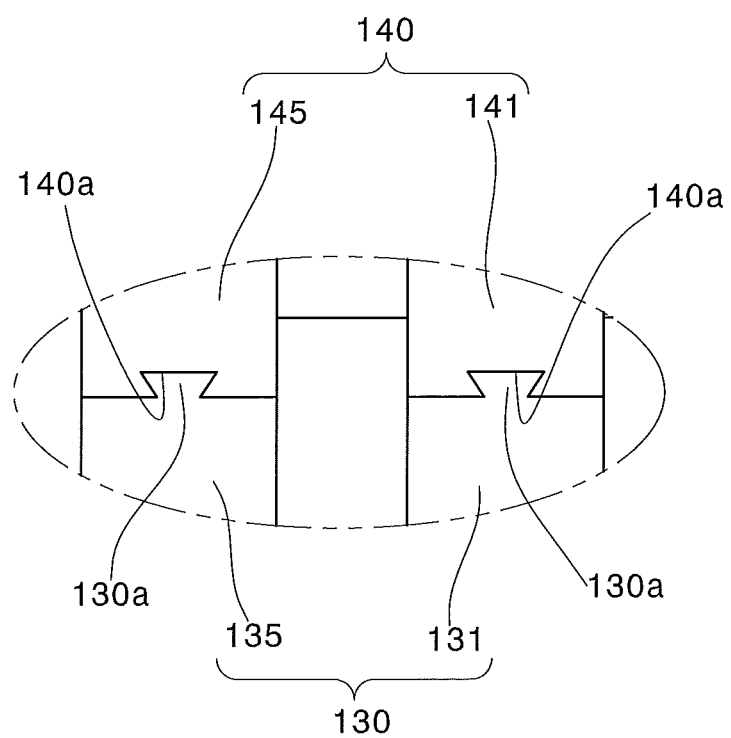
FIG. 3B is a magnifying view of part "A" in FIG. 3A.

FIG. 1 is a perspective view of an apparatus for transferring substrates in accordance with a first example embodiment of the present invention; FIG. 2 is an exploded perspective view showing the bottom of FIG. 1; FIG. 3A is a diagram showing the left of FIG. 2; and FIG. 3B is a magnifying view of part "A" in FIG. 3A.

As illustrated, the apparatus for transferring substrates in accordance with the first example embodiment of the present invention is installed on a floor of a transfer chamber of a cluster-type substrate processing device, and includes a supporting member 110 where a limited space is formed. The supporting member 110 may be formed in a variety of shapes such as a cylindrical, hexahedral, or square shape.

On the upper side of the supporting member 110, an elevating and rotating member 120 may be installed to be elevatable or descendable and rotatable. The elevating and rotating member 120 is connected with the upper part of a driving axis 113 which is elevated or descended and rotated by a driving unit (not illustrated) installed in the supporting member 110, and it is elevated or descended and rotated by the driving axis 113.

In the elevating and rotating member 120, a transferring unit which supports and transfers a substrate 50 (Refer to FIG. 5A) is installed. The transferring unit transfers the substrate 50 by giving linear motions while moving with the elevating and rotating member 120 at the same time.

The transferring unit may include a fixed member 130, a sliding member 140, and multiple hands 150.

The fixed member 130 is formed in a rectangular parallelepiped shape with a certain length, and it is connected with the upper side of the elevating and rotating member 120 while its longitudinal direction is roughly in parallel with the transferring direction of the substrate 50. The sliding member 140 roughly lies at a right angle to the fixed member 130 by being formed roughly in a shape as a square plate. Further, the sliding member 140 is installed to the fixed member 130 to be slid along the longitudinal direction of the fixed member 130. At the time, guide rails 130A (Refer to FIG. 3B) and guide grooves 140A (refer to FIG. 3B) guiding the motion of the sliding member 140 may be formed while the fixed member 130 is inserted into and combined with the sliding member 140.

As one ends of the hands 150 are combined with the sliding member 140, the hands 150 move with the sliding member 140 and the substrate 50 is loaded on, and supported by, the other ends of the hands 150.

The fixed member 130 may include multiple first fixed members 131 and multiple second fixed members 135 respectively installed on the upper side of the elevating and rotating member 120 and the sliding member 140 may include a first sliding member 141 installed to the first fixed members 131 and a second sliding member 145 installed to the second fixed members 135, respectively, to be slidable. On the upper side of the first sliding member 141, the second sliding member 145 may be located.

The first fixed members 131 may be installed at the inside of the second fixed members 135, and also on the upper side of the elevating and rotating member 120 through the medium of a spacing member 133 (Refer to FIG. 2). In other words, the first fixed members 131 have a certain interval from the upper side of the elevating and rotating member 120 due to the spacing member 133.

A bracket 167 between the first fixed member 131 and the upper side of the elevating and rotating member 120 is placed to connect the first fixed member 131 and a second arm 165 to be explained later.

One connecting plate 137 is combined with one ends of the first fixed members 131 and one ends of the second fixed members 135 in such a way that one ends of the first fixed members 131 and one ends of the second fixed members 135 are connected with each other.

Further, the other connecting plate 137 is combined with the other ends of the first fixed members 131 and the other ends of the second fixed members 135 in such a way that the other ends of the first fixed members 131 and the other ends of the second fixed members 135 are connected with each other.

The hands 150 include multiple first hands 151 connected with the first sliding member 141 and second hands 155 connected with the second sliding member 145. Since the second sliding member 145 is located above the first sliding member 141, it is natural that the second hands 155 are located on the upper sides of the first hands 151.

The first hands 151 and the second hands 155 are placed up and down to make the first hands 151 load the substrate 50 and make the second hands 155 unload it, or to make the first hands 151 unload it and make the second hands 155 load it. Accordingly, the apparatus for transferring substrates in accordance with the first example embodiment of the present invention may load or unload the substrate 50 at a time by using the first hands 151 and the second hands 155.

The sliding member 140 may give linear reciprocating motion while it is slid by the first arms 161 and the second arms 165.

In more detail, the first arm 161 may be formed in a case shape, and one end thereof is supported by the one end of the elevating and rotating member 120 to be rotatable. At the other end of the first arm 161, a rotation axis 161A is installed to be rotatable. Further, an arm driving part (not illustrated) including a motor 170 (Refer to FIG. 4A) rotating the rotation axis 161A, a gear and so forth may be installed in the first arm 161.

In addition, one end of the second arm 165 may be supported on one side of the sliding member 140 to be rotatable, and the other end thereof may be press-fitted with the rotation axis 161A. Therefore, when the rotation axis 161A is rotated, the second arm 165 is also rotated.

In short, the arm driving part rotates the rotation axis 161A, and the second arm 165 pivots on the rotation axis 161A due to its rotation. This causes the first arms 161 and the second arms 165 to move in a folded or unfolded form. Due to folding or unfolding of the first arms 161 and the second arms 165, the sliding member 140 is slid.

One pair of the first arm 161 and the second arm 165 and the other pair of the first arm 161 and the second arm 165 may be installed while facing each other across the transferring unit. Accordingly, one end of either of the first arms 161 is supported by one side of the elevating and rotating member 120 to be rotatable. Further, one end of either of the second arms 165 connected with the above-mentioned one end of the first arm 161 is supported by one end of the first sliding member 141 to be rotatable. Besides, one end of the other first arm 161 is supported by the other end of the elevating and rotating member 120 to be rotatable while one end of the other second arm 165 connected with the other first arm 161 is supported by one side of the second sliding member 145 to be rotatable. Therefore, a first sliding member 141 is slid by either of the first arms 161 and either of the second arms 165 and a second sliding member 145 is slid by the other first arm 161 and the other second arm 165.

At this time, motions of either of the first arms 161 and either of the second arms 165 mutually connected and linked and those of the other first arm 161 and the other second arm 165 mutually connected and linked are independent. Accordingly, the first sliding member 141 and the second sliding member 145 give motions independently, and when the substrate 50 is unloaded by the first hands 151, the substrate 50 may be loaded by the second hands 155.

Figure 4A:
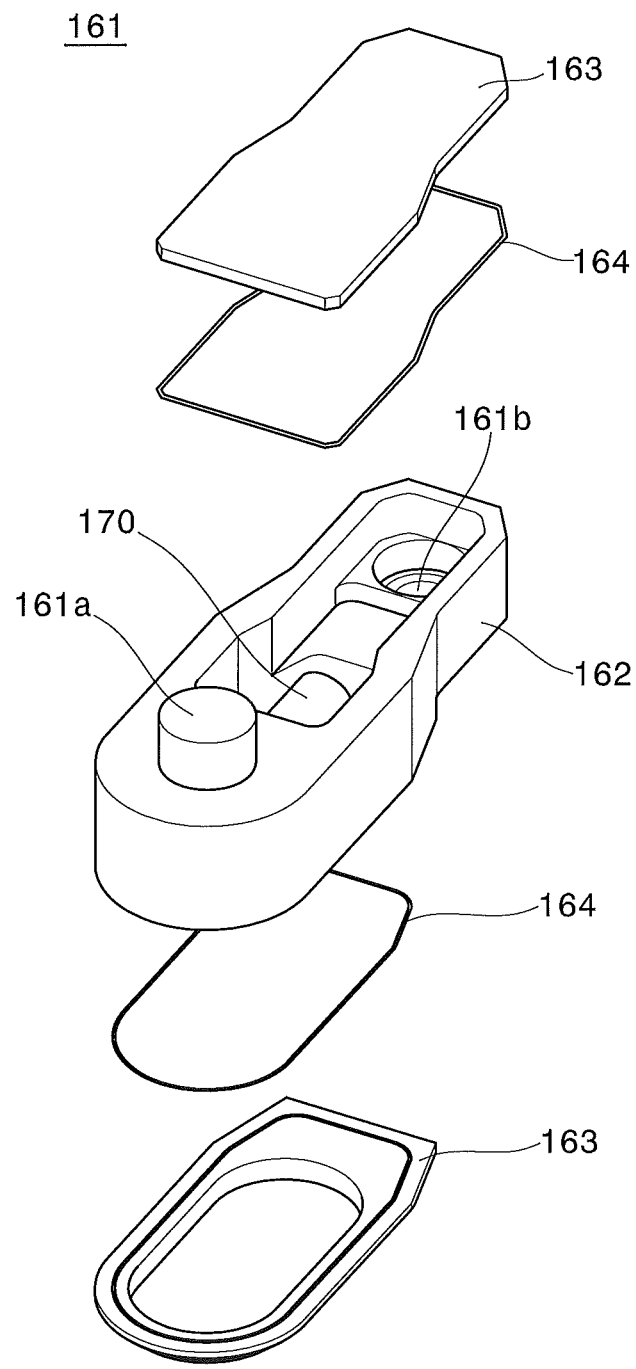
FIG. 4A is an exploded perspective view of a first arm illustrated in FIG. 1.
Figure 4B:
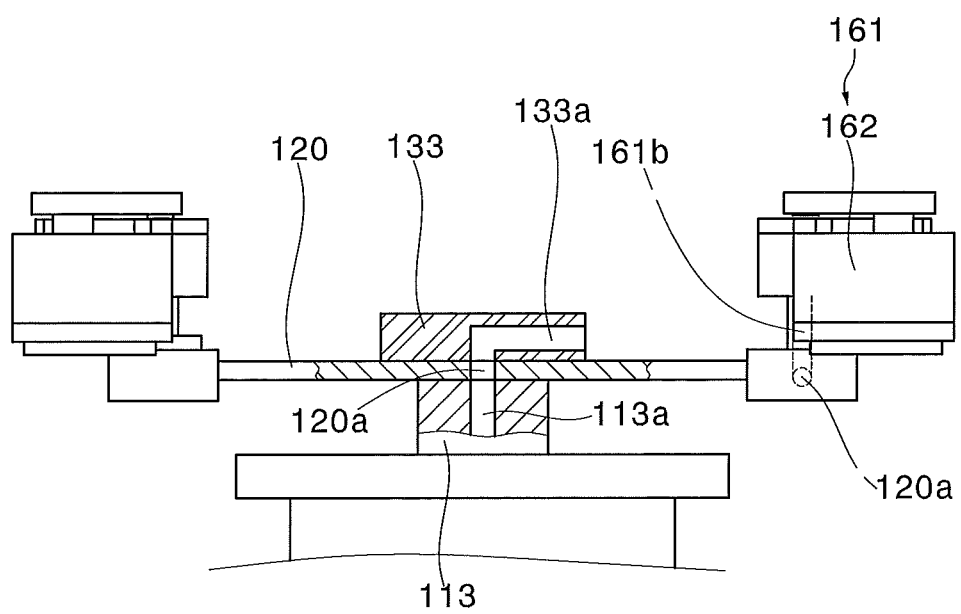
FIG. 4B is an overview cross-sectional view of a driving axis, an elevating and rotating member, a spacing member and the first arms.

FIG. 4A is an exploded perspective view of the first arm illustrated in FIG. 1 and FIG. 4B is an overview cross-sectional view of a driving axis, an elevating and rotating member, a spacing member and the first arm. The diagrams are explained in detail below.

As illustrated, the first arm 161 forms a certain space therein. Further, the first arm 161, with a shape of rectangular case, includes a body 162 whose at least either of the upper side or the undersurface is opened and at least one cover 163 combined to the upper side and/or the undersurface of the body 162. At the time, sealing members 164 may lie between the body 162 and each cover 163 to seal the two.

As explained above, the rotation axis 161A connected with the other side of the second arm 165 is installed on the other end of the body 162 which corresponds to the other end of the first arm 161 and the arm driving part is installed in the body 162 to rotate the rotation axis 161A.

However, external power must be supplied to the arm driving part to run the arm driving part. To do this, the driving axis 113, the elevating and rotating member 120, and the spacing member 133 are interconnected so that paths 113A, 120A and 133A where cables (not illustrated) are passed can be formed through the driving axis 113, the elevating and rotating member 120, and the spacing member 133 respectively. Even on the bottom surface of the body 162, a path 161B through which the cables are passed is formed.

The motions of the apparatus for transferring substrates in accordance with the first example embodiment of the present invention are explained by referring to FIGS. 5A to 5D. FIGS. 5A to 5D, which are plans of FIG. 1, shows the motions of the apparatus for transferring substrates in accordance with the first example embodiment of the present invention.

As the sliding motion of the first sliding member 141 is same as that of the second sliding member 145, only sliding of the first sliding member 141 is explained.

Figure 5A:
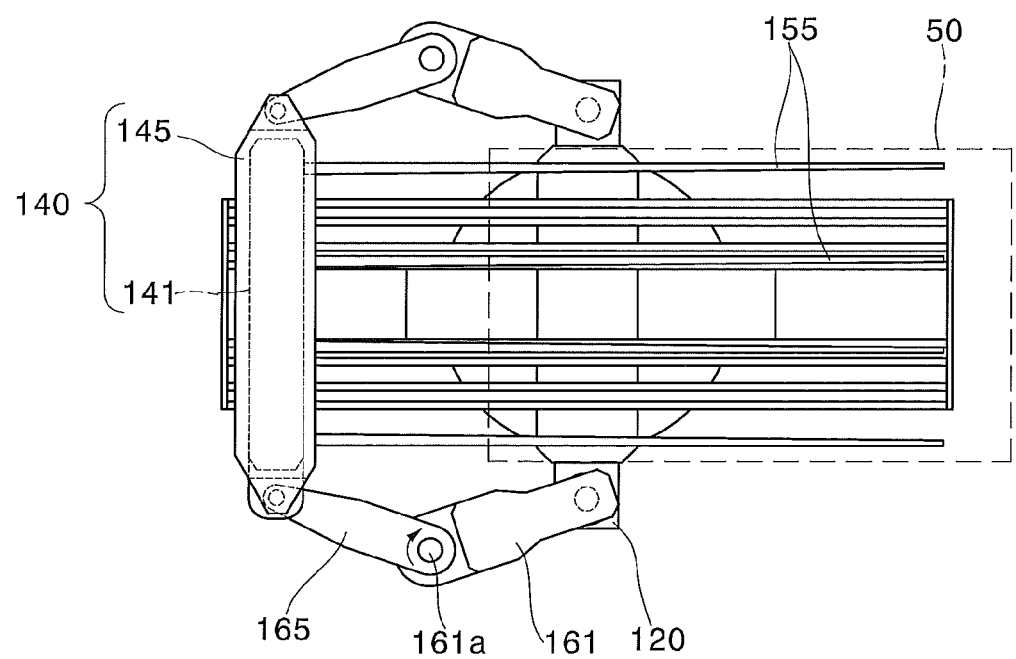
FIGS. 5A to 5D show motions of the apparatus for transferring substrates of FIG. 1 in accordance with the first example embodiment of the present invention.

In FIG. 5A, it is supposed that the first arm 161 is located on the right side of the second arm 165 (i.e., on the right side from the viewpoint of a person who watches FIG. 5A; and explanation in the other parts of this specification is similar to this), and it is supposed that the state of the first arm 161 and the second arm 165 which are unfolded based on the rotation axis 161A is an initial state. At the state illustrated in FIG. 5A, the first hands 151 located under the second hands 155 are hidden by the second hands 155.

When the rotation axis 161A rotates clockwise from the state illustrated in FIG. 5A by the arm driving part installed in the first arm 161, the second arm 165 rotates in a clockwise direction based on the rotation axis 161A. Then, as one end of the first arm 161 is supported by the elevating and rotating member 120, the first arm 161 and the second arm 165 move to a direction of being folded while being closer with each other based on the rotation axis 161A as illustrated in FIG. 5B.

Figure 5B:
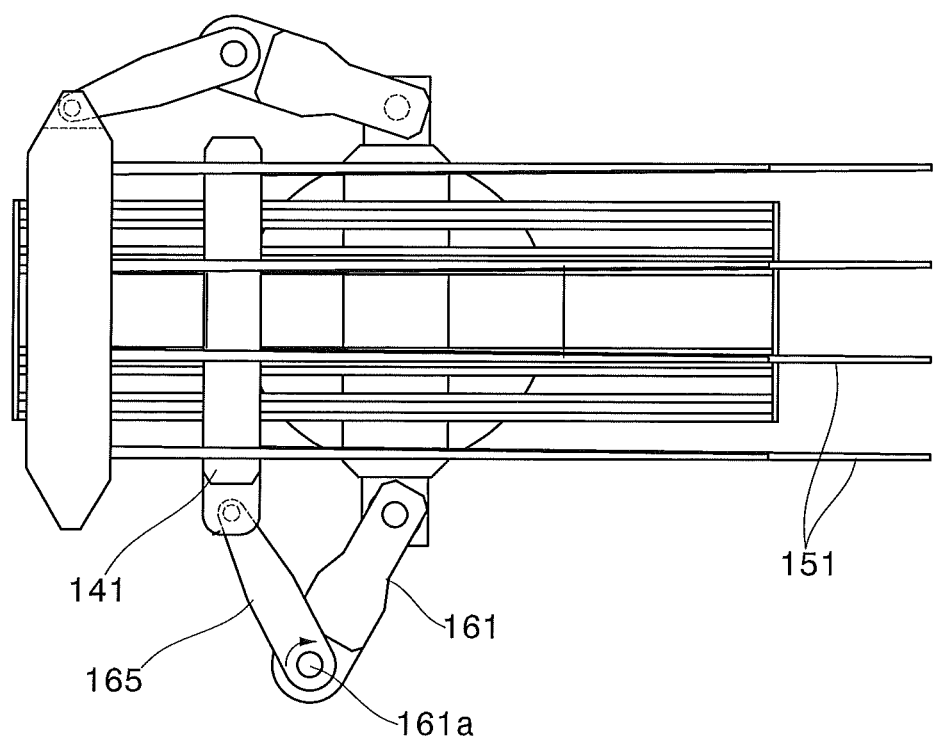
Figure 5C:
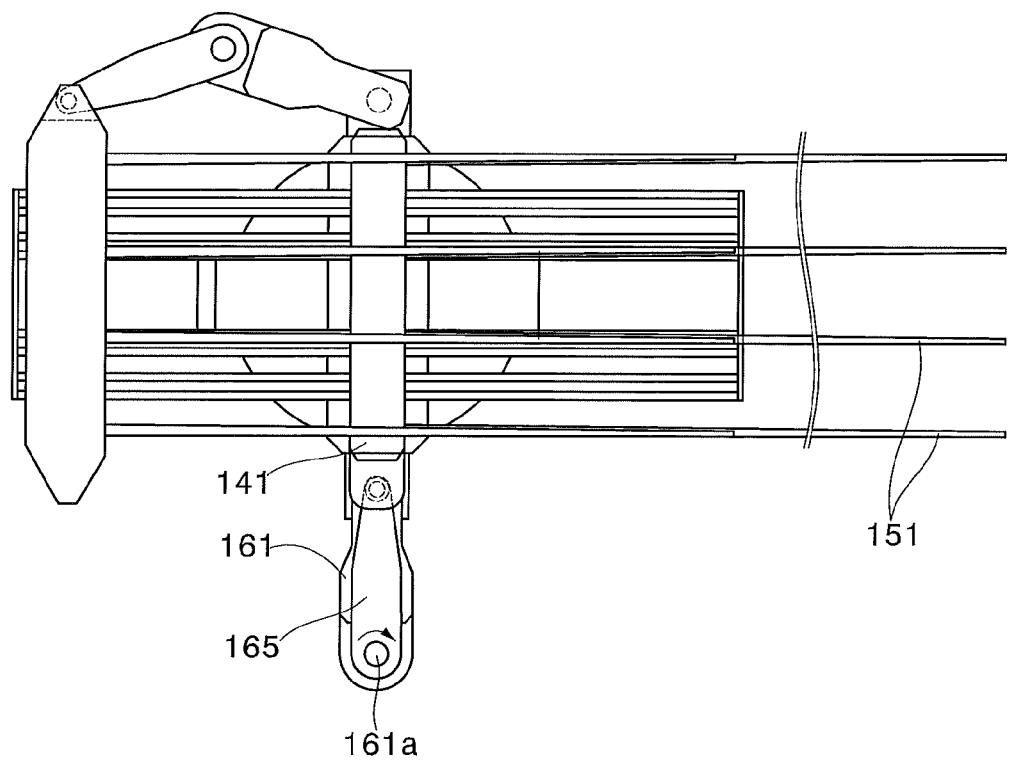

When the second arm 165 further rotates clockwise from the state illustrated in FIG. 5B by the arm driving part, a virtual linear line connecting both ends of the first arm 161 and that connecting both ends of the second arm 165 are overlapped and become parallel, and become at the state of singularity, as illustrated in FIG. 5C.

Figure 5D:
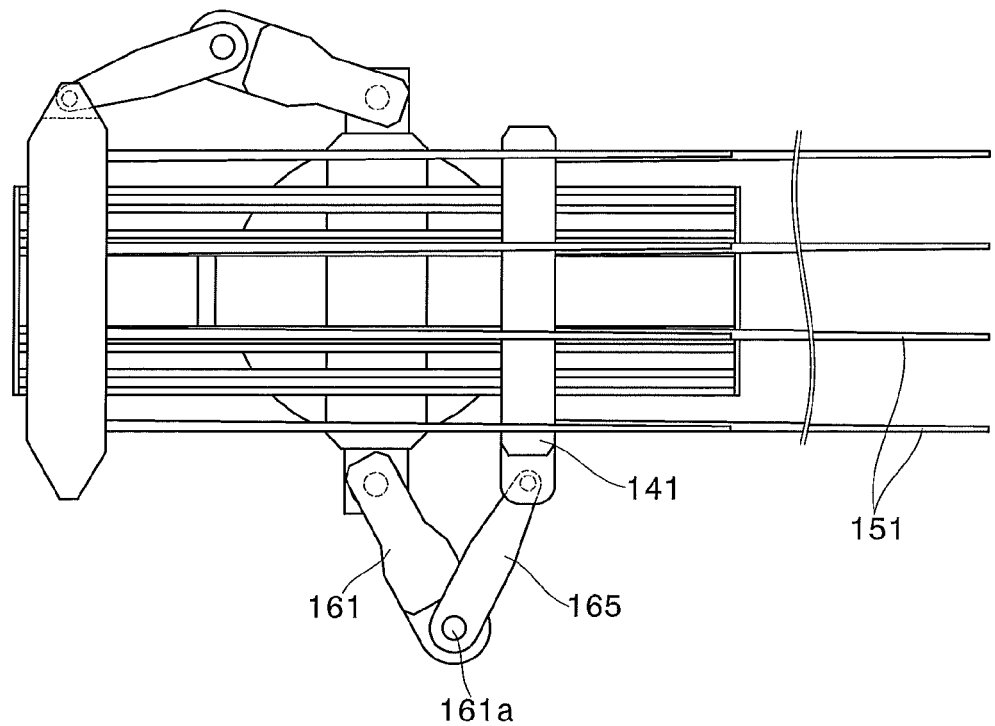

When the second arm 165 further rotates clockwise from the state illustrated in FIG. 5C by the arm driving part, the second arm 165 becomes located on the right of the first arm 161 and then the first arm 161 and the second arm 165 become at the unfolded state as illustrated in FIG. 5D. In other words, as the second arm 165 pivots on the part supported by the first arm 161, even though the first arm 161 and the second arm 165 are arranged at the state of singularity, the second arm 165 can rotate easily. Therefore, the second arm 165 is easily out of the state of singularity, and it becomes unfolded with the first arm 161.

Then, the first sliding member 141 gives a linear motion from left to right by the second arm 165 and thus the first hands 151 move from left to right by the first sliding member 141. Accordingly, the substrate 50 may be transferred.

Thereafter, when the second arm 165 rotates counterclockwise, i.e., in a reverse direction, from the state illustrated in FIG. 5D by the arm driving part, the first arm 161 and the second arm 165 become at the state illustrated in FIG. 5A, which is the initial state.

As the first sliding member 141 and the second sliding member 145 are independently slid, when the substrate 50 is unloaded by the first hands 151, other substrate can be loaded by the second hands 155.

The second arm 165 of the substrate processing device in accordance with the first example embodiment of the present invention pivots on the other end of the second arm 165, i.e., an end where the second arm 165 is exposed outside the sliding member 140, in a clockwise or a counterclockwise direction by the arm driving part. Accordingly, the first arm 161 and the second arm 165 may be unfolded easily even at the state of singularity.

Figure 6:
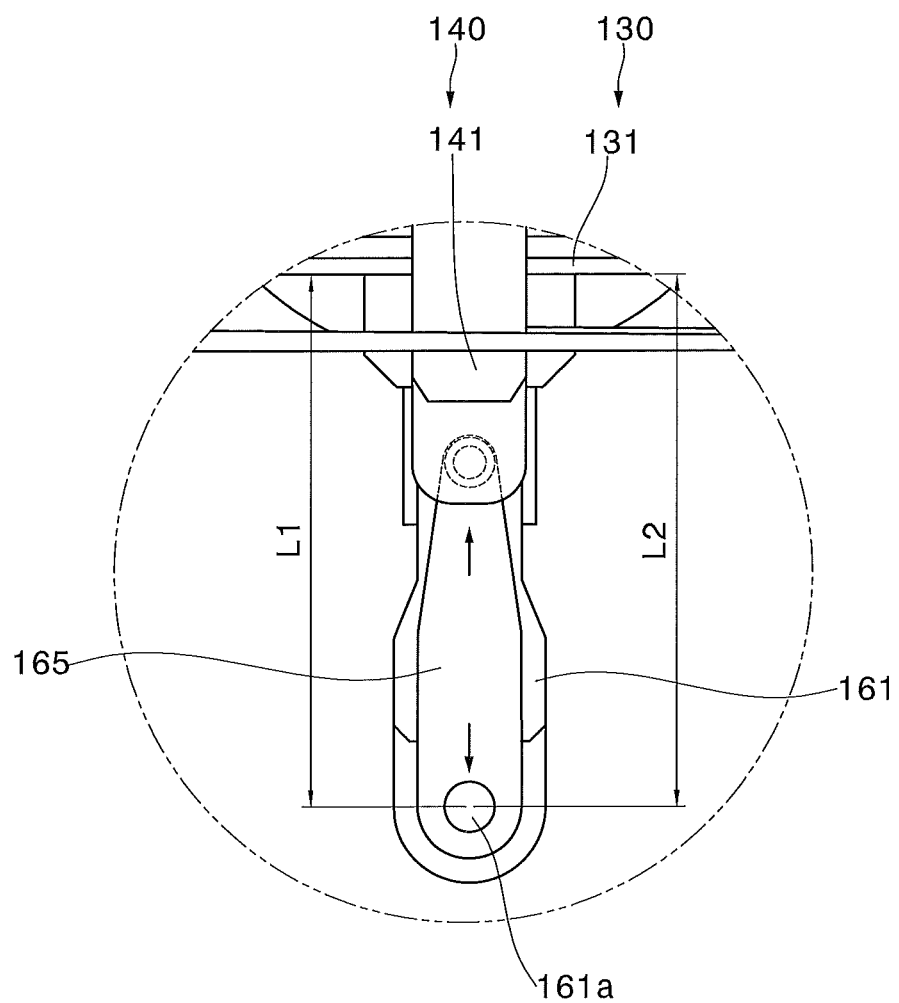
FIG. 6 is a plan showing an arrangement of the first arm and the second arm illustrated in FIG. 1 at the state of singularity.

FIG. 6 is a plan showing an arrangement of the first arm and the second arm illustrated in FIG. 1 at the state of singularity. FIG. 6 is explained as shown below.

As illustrated, when the first arm 161 and the second arm 165 are arranged at the state of singularity, a vertical distance L1 from the first arm 161 to the side of the first fixed member 131 of the fixed member 130 based on the rotation axis 161A may be equal to a vertical distance L2 from the second arm 165 to the side of the first fixed member 131 of the fixed member 130 based on the rotation axis 161A to allow the first arm 161 and the second arm 165 to be unfolded.

Reversely, based on the rotation axis 161A, the vertical distance L1 from the first arm 161 to the side of the first fixed member 131 of the fixed member 130 may be equal to the vertical distance L2 from the second arm 165 to the side of the first fixed member 131 of the fixed member 130 to allow the first arm 161 and the second arm 165 to be easily folded.

However, in general, the lengths of the first arm 161 and the second arm 165 may become longer by being thermally deformed because the apparatus for transferring substrates is used in a high temperature environment. The lengths become further longer because the second arm 165 whose one end is supported by the sliding member 140 is much more influenced over heat generated by the substrate processing device in the high temperature environment and a hot substrate. More specifically, the second arm 165 is further more influenced over heat because the second arm 165 is located at a relatively much closer place to the substrate processing device at the moment that the substrate is loaded to or unloaded from the substrate processing device.

When the first arm 161 and the second arm 165 are arranged at the state of singularity, the second arm 165 becomes fit tightly to the rotation axis 161A due to the extension of the second arm 165. Then, according to the prior art, great strength is required to get out of the state of singularity by rotating the second arm 165.

To prevent this, as for the apparatus for transferring substrates in accordance with the first example embodiment of the present invention, it is desirable to form the second arm 165 which is much influenced by heat with a more heat-resistant material than the first arm 161 which is relatively less influenced due to the substrate processing device in the high-temperature environment.

In brief, it is desirable to form the second arm 165 with a material having a lower thermal expansion coefficient than the first arm 161, and more desirably, that the first arm 161 is made of aluminum and the second arm 165 is made of steel.

Then, as the second arm 165 is less deformed by heat, it is possible to rotate the second arm 165 with small force to be out of the state of singularity.

In the first arm 161 in a case shape that includes the body 162 and the cover 163, a cooling system (not illustrated) such as a cooling tube may be installed.

Second Example Embodiment

Figure 7:
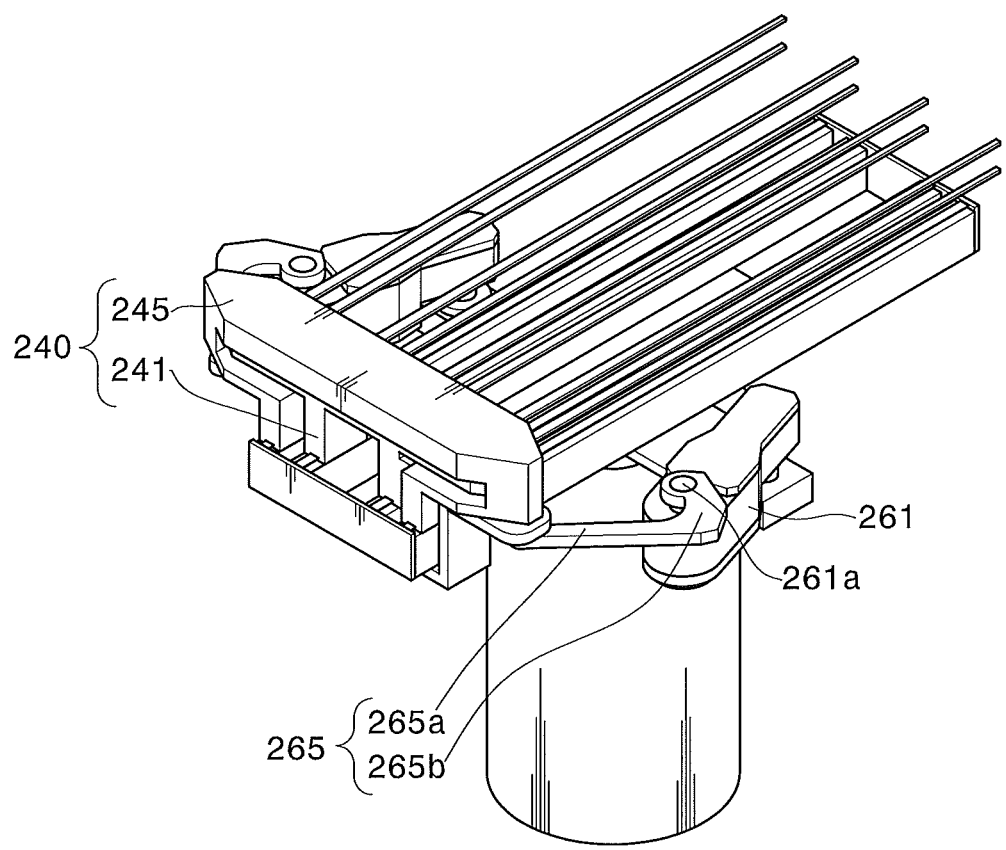
FIG. 7 is a perspective view of an apparatus for transferring substrates in accordance with a second example embodiment of the present invention.

FIG. 7 is a perspective view of an apparatus for transferring substrates in accordance with a second example embodiment of the present invention. Only the differences from the first example embodiment are explained below.

As illustrated, a second arm 265 may be formed in a bent shape including a first body part 265A and a second body party 265B and one and the other end of the second arm 265 correspond, respectively, to an end of the first body part 265A and that of the second body part 265B.

Therefore, the end of the first body part 265A is supported by a sliding member 240 of the transferring unit to be rotatable, and that of the second body part 265B is press-fitted with a rotation axis 261A and rotated by the arm driving part. As the second body part 265B pivots on the rotation axis 261A, which corresponds to the other end of the first arm 261, the first arm 261 and the second arm 265 move in a form of being folded or unfolded.

The first body part 265A and the second body part 265B may be formed in one body, but they would not be limited thereto.

FIGS. 8A to 8D which are plans of FIG. 7 showing the motions of the apparatus for transferring substrates in accordance with the second example embodiment of the present invention are explained below.

As the sliding motion of the first sliding member 241 is same as that of the second sliding member 245, only sliding of the first sliding member 241 is explained.

Figure 8A:
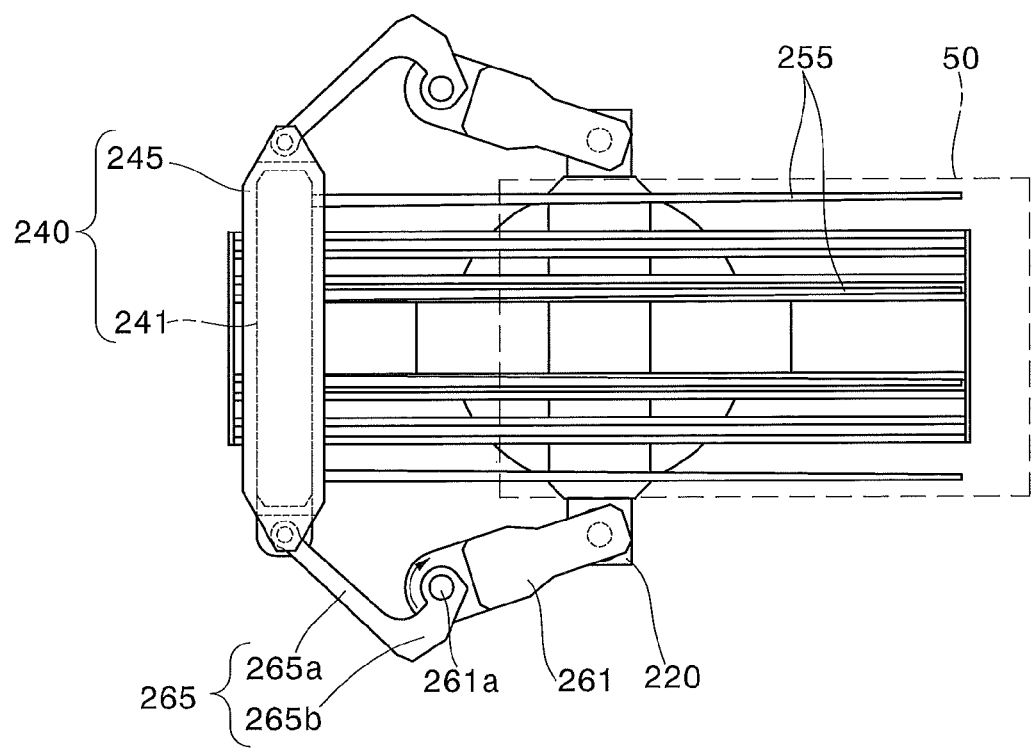
FIGS. 8A to 8D show motions of the apparatus for transferring substrates of FIG. 7 in accordance with the second example embodiment of the present invention.

In FIG. 8A, it is supposed that the first arm 261 is located on the right side of the second arm 265 (i.e., on the right side from the viewpoint of a person who watches FIG. 8A; and explanation in the other parts of this specification is similar to this), and it is supposed that the state of the first arm 261 and the second arm 265 which are unfolded based on the rotation axis 261A is an initial state. At the state illustrated in FIG. 8A, the first hands 251 located under the second hands 255 are hidden by the second hands 255.

When the rotation axis 261A rotates clockwise from the state illustrated in FIG. 8A by the arm driving part installed in the first arm 261, the second arm 265 rotates in a clockwise direction based on the rotation axis 261A. Then, as one end of the first arm 261 is supported by the elevating and rotating member 220, the first arm 261 and the second arm 265 move to a direction of being folded while being closer with each other based on the rotation axis 261A, as illustrated in FIG. 5B.

Figure 8B:
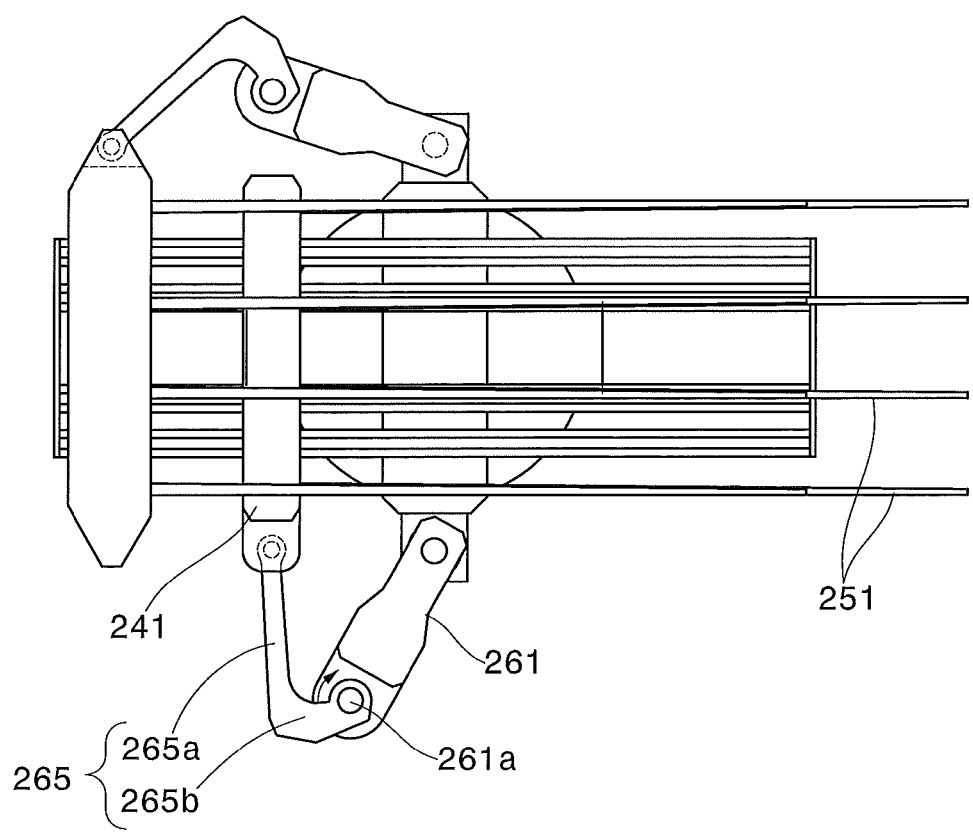
Figure 8C:
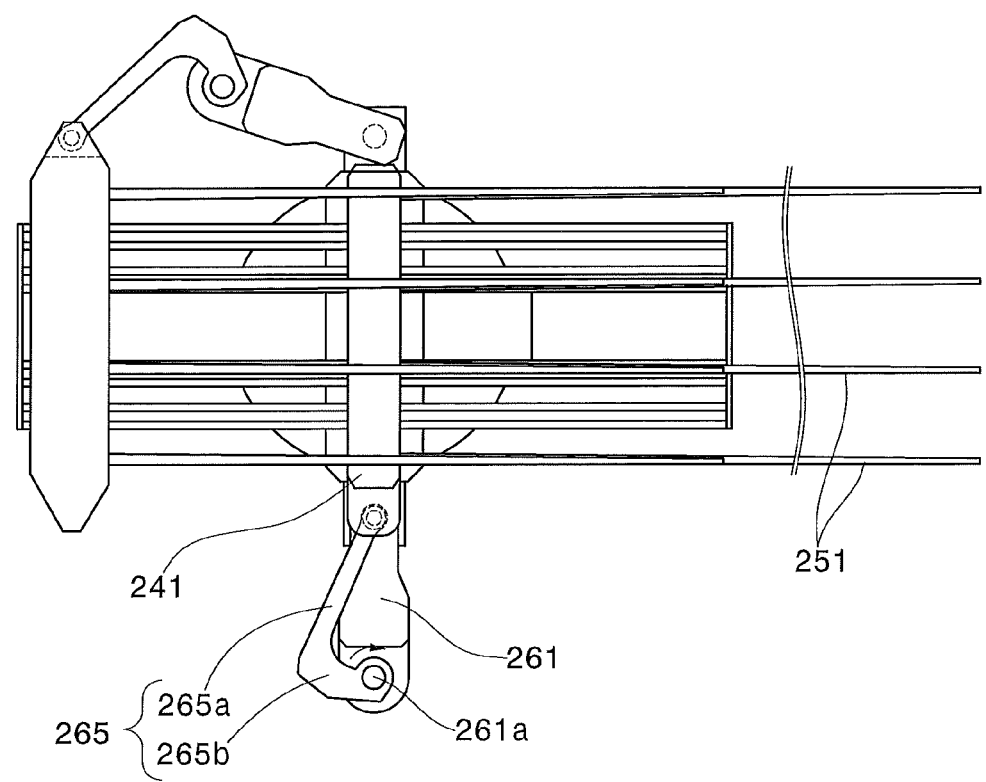

When the second arm 265 further rotates clockwise from the state illustrated in FIG. 8B by the arm driving part, a virtual linear line connecting both ends of the first arm 261 and that connecting both ends of the second arm 265 are overlapped and become parallel, and become at the state of singularity as illustrated in FIG. 8C.

Figure 8D:
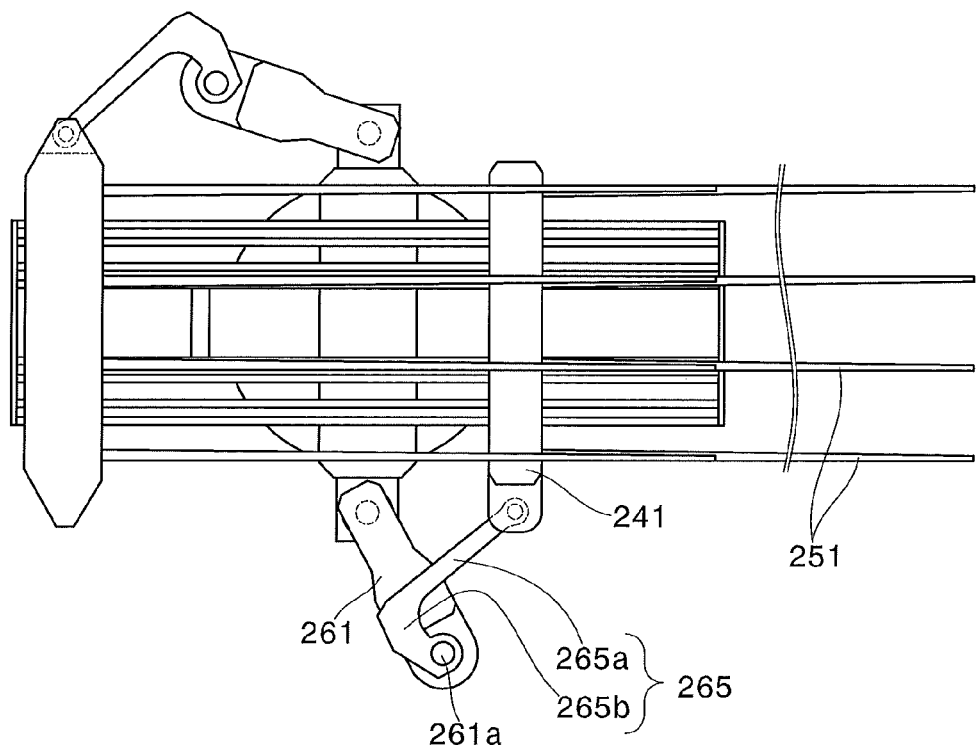

When the second arm 265 further rotates clockwise from the state illustrated in FIG. 8C by the arm driving part, the second arm 265 is located on the right side of the first arm 261, the first arm 261 and the second arm 265 become at the unfolded state as illustrated in FIG. 8D. In other words, as the second arm 265 pivots on the part supported by the first arm 261, even though the first arm 261 and the second arm 265 are arranged at the state of singularity, the second arm 265 rotates easily. Therefore, while the second arm 265 is easily out of the state of singularity, it becomes unfolded with the first arm 261.

Then, the first sliding member 241 gives a linear motion from left to right by the second arm 265 and thus the first hands 251 move from left to right by the first sliding member 241. Accordingly, the substrate 50 may be transferred.

Thereafter, when the second arm 265 rotates counterclockwise, i.e., in a reverse direction, from the state as illustrated in FIG. 8D by the arm driving part, the first arm 261 and the second arm 265 become at the state as illustrated in FIG. 8A, which is the initial state.

As the first sliding member 241 and the second sliding member 245 are independently slid, when the substrate 50 is unloaded by the first hands 251, other substrate 50 can be loaded by the second hands 255.

The second arm 265 of the substrate processing device in accordance with the second example embodiment of the present invention pivots on the other end of the second arm 265, i.e., an end where the second arm 265 is exposed outside the sliding member 240, in a clockwise or a counterclockwise direction by the arm driving part. Accordingly, the first arm 261 and the second arm 265 may be unfolded easily even at the state of singularity.

Figure 9:
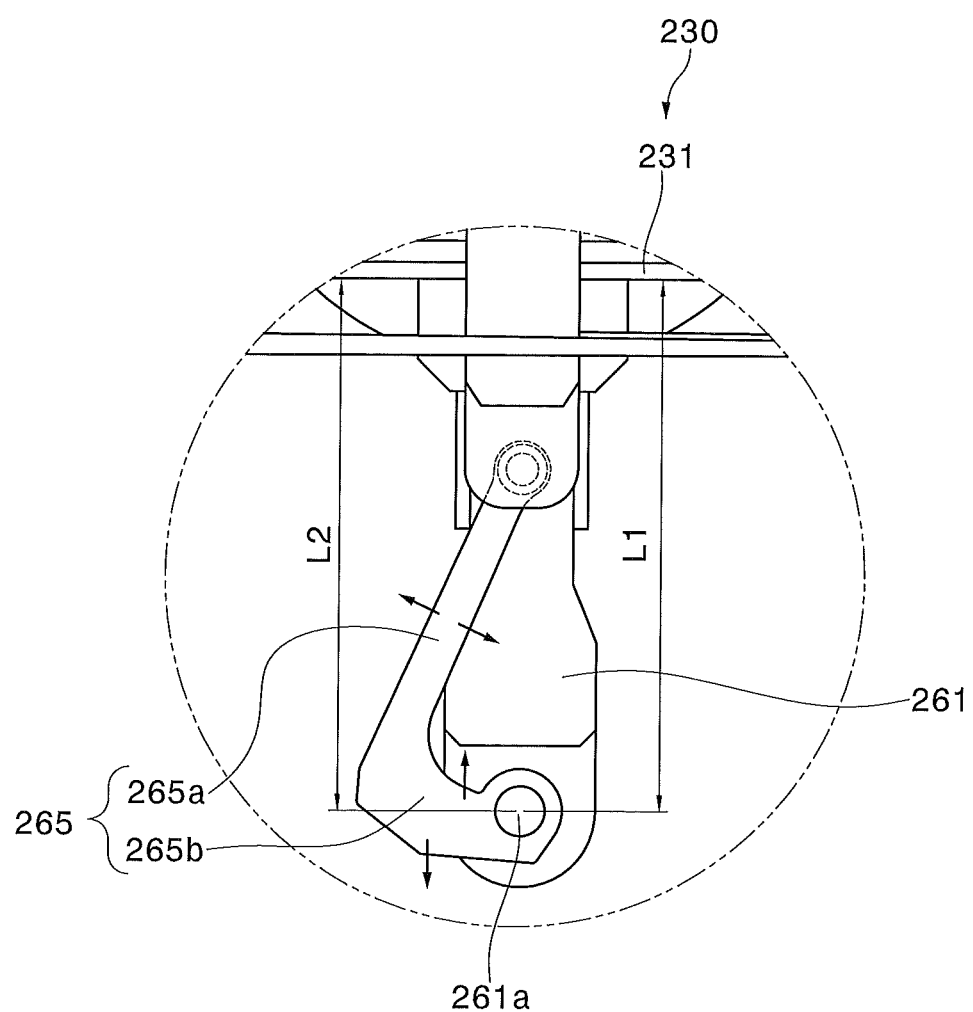
FIG. 9 is a plan showing an arrangement of the first arm and the second arm illustrated in FIG. 7 at the state of singularity.

FIG. 9 is a plan showing an arrangement of the first arm and the second arm illustrated in FIG. 7 at the state of singularity. FIG. 9 is explained below.

As illustrated, when the first arm 261 and the second arm 265 are arranged at the state of singularity, a vertical distance L1 from the first arm 261 to the side of the first fixed member 231 of the fixed member 230 may be equal to a vertical distance L2 from the second arm 265 to the side of the first fixed member 231 of the fixed member 230 based on the rotation axis 261A to allow the first arm 261 and the second arm 265 to be unfolded.

Reversely, based on the rotation axis 261A, the vertical distance L1 from the first arm 261 to the side of the first fixed member 231 of the fixed member 230 may be equal to the vertical distance L2 from the second arm 265 to the side of the first fixed member 231 of the fixed member 230 to allow the first arm 261 and the second arm 265 to be easily folded.

However, in general, the lengths of the first arm 261 and the second arm 265 may become longer by being thermally deformed because the apparatus for transferring substrates is used in the high temperature environment. The length becomes further longer because the second arm 265 whose one end is supported by the sliding member 240 is much more influenced over heat generated by the substrate processing device in the high temperature environment and a hot substrate.

When the first arm 261 and the second arm 265 are arranged at the state of singularity, the second arm 265 becomes fit tightly to the rotation axis 261A due to the extension of the second arm 265. Then, according to the prior art, great strength is required to get out of the state of singularity by rotating the second arm 265.

But the second arm 265 of the apparatus for transferring substrates in accordance with the second example embodiment of the present is formed in a bent shape, including the first body part 265A and the second body part 265B. To shrink the length of the second arm 265 which is extended, the boundary zone of the first body part 265A and the second body part 265B may be bent to the direction of being folded or unfolded.

However, because the second arm 165 in accordance with the first example embodiment of the present invention illustrated in FIG. 6 is a linear type, when the first arm 161 and the second arm 165 are arranged at the state of singularity, the second arm 165 must be shrunk by acting force in a direction parallel in its longitudinal direction to get out of the state of singularity.

It is natural that the force of shrinking the second arm 265 which is slightly bent to a direction of unfolding or folding the boundary zone of the first body part 265A and the second body part 265B thereof, as illustrated in FIG. 9 is much less than that of shrinking the second arm 165 in a direction in parallel to the vertical direction of the second arm 165 as illustrated in FIG. 6. It is because hardness of the second arm 265 is lower than that of the second arm 165 assuming that the second arm 265 and the second arm 165 were manufactured in a same condition in comparison.

The length of the first body part 265A of the second arm 265 may be same as, or longer or shorter than, that of the second body part 265B. Further, the first body part 265A and the second body part 265B themselves may be linear and may be formed in an arch shape as well.

As explained above, the second arm 265, formed in a bent shape, may be easily rotated with relatively less force by extending or shrinking it at the state of singularity. Because the second arm 265 which is arranged at the state of singularity is extended or shrunk by less force, and the hardness of the second arm 265 is lower than that of the second arm 165, when the second arm 265 returns to the initial state by its elasticity from the extended or shrunk state, repulsive power is reduced. Therefore, it brings the effect of reducing shock and vibration.

It is natural that the apparatus for transferring substrates in accordance with the second example embodiment of the present invention may also form the second arm 265 with a more heat-resistant material than the first arm 261. In other words, the second arm 265 may be formed with a material having a lower thermal expansion coefficient than the first arm 261, and more desirably, the first arm 261 is made of aluminum and the second arm 265 is made of steel. It is natural that a cooling system (not illustrated) such as a cooling tube in the first arm 261 may be installed.

When a transferring distance of the substrate 50 is long, the lengths of the first arm 261 and the second arm 265 must be extended longer. Accordingly, hardness of the first arm 261 and the second arm 265 must be higher. Further, when the weight of the substrate 50 is heavy, the hardness of the first arm 261 and the second arm 265 must be higher. The first arm 261 may secure enough hardness because it is formed in a case shape, but the second arm 265 is formed in a bar shape. Accordingly, to improve hardness of the second arm 265, the thickness thereof must be increased.

An apparatus for transferring substrates in accordance with the third example embodiment of the present invention whose hardness is improved without being thicker is explained below.

Third Example Embodiment

Figure 10:
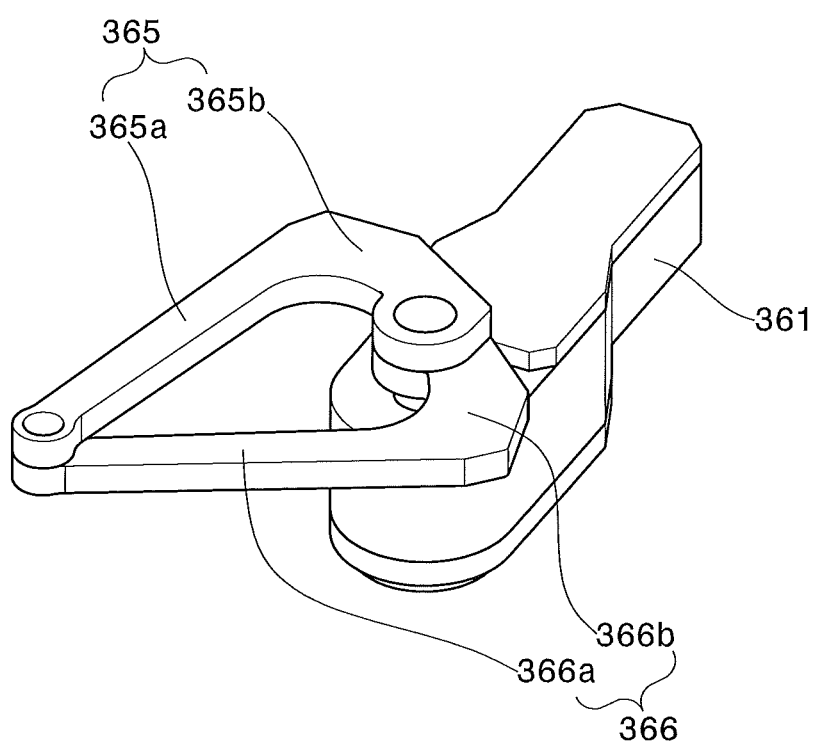
FIG. 10 is a perspective view of the first arm and the second arm of the apparatus for transferring substrates in accordance with a third example embodiment of the present invention.
Figure 11:
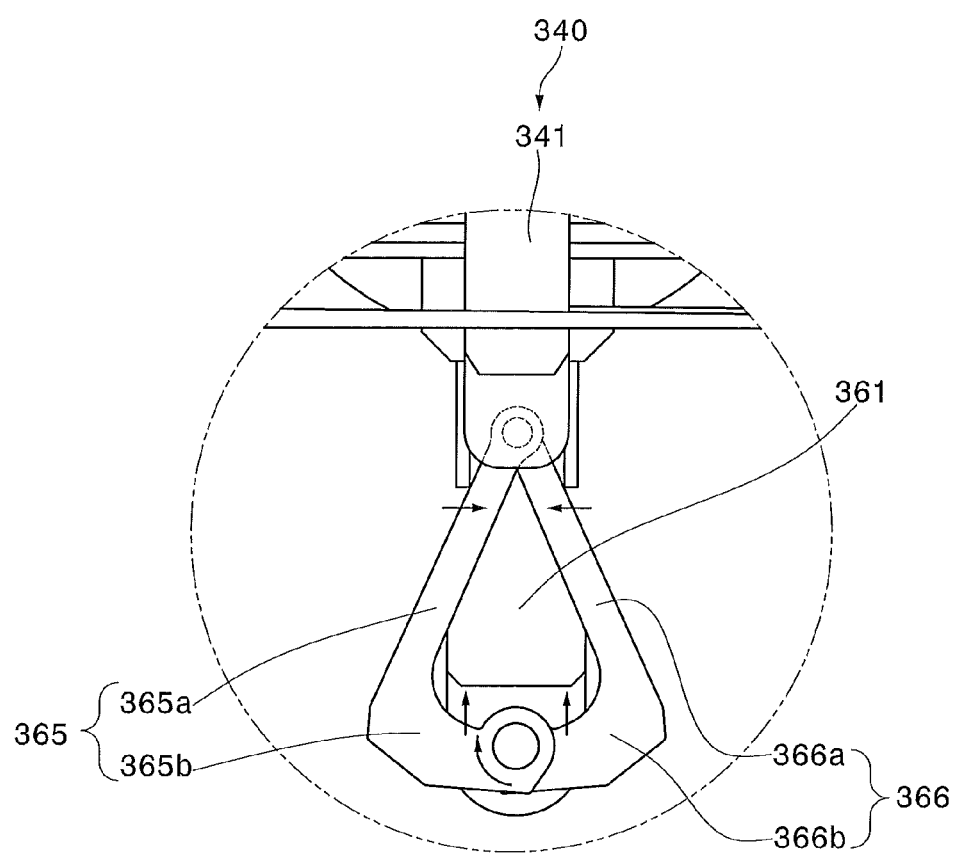
FIG. 11 is a plan showing an arrangement of the first arm and the second arm illustrated in FIG. 10 at the state of singularity.

FIG. 10 is a perspective view of the first arm and the second arm of the apparatus for transferring substrates in accordance with a third example embodiment of the present invention and FIG. 11 is a plan showing an arrangement of the first arm and the second arm illustrated in FIG. 10 at the state of singularity. Only the differences from the second example embodiment are explained below.

As illustrated, the second arm includes a pair of sub-arms 365 and 366 and a pair of sub-arms 365 and 366 are made while the sub-arms 365 and 366 are symmetrical to each other.

At the time, ends of first body parts 365A and 366A of the sub-arms 365 and 366 are supported by a first sliding member 341 of the sliding member 340 of the transferring unit to be rotatable, and ends of second body parts 365B and 366B are supported respectively to the other end of the first arm 361 to be rotatable and at the same time they are rotated by the arm driving part. It is desirable that the first body part 365A of the sub-arm 365 and the first body part 366A of the sub-arm 366 which are supported by the sliding member 340 to be rotatable are concentric to the center of rotation supported by the sliding member 340, and the second body part 365B of the sub-arm 365 and the second body part 366B of the sub-arm 366 supported respectively by the first arm 361 to be rotatable are concentric to the center of rotation supported by the first arm 361.

Because the sub-arms 365 and 366 are paired, it is natural that it is possible to improve hardness without increasing thickness of the sub-arms 365, 366.

If the sub-arms 365 and 366 are bent to shrink or extend the sub-arms 365 and 366, forces in a vertical direction and in a horizontal direction are at work, respectively, to the sub-arm 365 and the sub-arm 366. Because the force in the horizontal direction at work to the sub-arm 365 offsets that to the sub-arm 366, it is possible to shrink or extend the sub-arms 365 and 366 with relatively less force.

In short, the force required to shrink or extend the second arm, i.e., the sub-arms 365 and 366 in a pair, in accordance with the third example embodiment of the present invention is not increased in proportion to the force necessary to shrink or extend the second arm 265 in accordance with the second example embodiment of the present invention.

The sub-arms 365 and 366 arranged symmetrically in a pair were exemplarily illustrated, but it is natural that the present invention is not confined thereto. In other words, the pair of the sub-arms 365 and 366 may be asymmetrical. In addition, the sub-arms are not necessary to be composed as two arms, but they might be three or more arms.

Assuming that the second arm 265 in accordance with the second example embodiment of the present invention were formed as a pair just like the sub-arms 365 and 366 in accordance with the third example embodiment of the present invention, the second arm 265 might be thinner.

In the apparatus for transferring substrates in accordance with the present invention, the end of the second arm connected with the end of the first arm exposed outside the sliding member rotates clockwise or counterclockwise by the arm driving part. Accordingly, even though the virtual linear line connecting both ends of the first arm and that connecting both ends of the second arm are overlapped and paralleled at the state of singularity, the first arm and the second arm are easily unfolded. Accordingly, only with the first arm and the second arm, the sliding member where hands are installed may be easily slid. Therefore, it may save costs due to the simple structure.

In addition, since the second arm much influenced by heat is formed with the more heat-resistant material, the second arm is relatively less deformed. Accordingly, it is possible to rotate the second arm with less force to get out of the state of singularity.

Furthermore, the other end of the second arm connected with the other end of the first arm may be bent. In this case, even though the lengths of the first arm and the second arm are deformed due to heat, etc., it may bring an effect of making the second arm get out of the state of singularity by rotating the second arm with less force.

The detailed outlines of the drawings of the example embodiments of the present invention as described above are omitted, but exemplarily illustrated to easily identify parts belonging to technological thought of the present invention. In addition, the example embodiments abovementioned must not be references to confine the technological thought of the present invention, but only referential matters to understand technological matters included in the patent claims of the present invention.

What is claimed is:

1. An apparatus for transferring substrates, comprising:
   a supporting member;
   an elevating and rotating member installed to be elevated or descended and rotated on the upper side of the supporting member;
   a transferring unit, which is installed on the elevating and rotating member, for making linear motions to transfer substrates when the elevating and rotating member moves;
   a first arm with a first end supported by the elevating and rotating member to be rotatable;
   a second arm with a first end supported by the transferring unit to be rotatable and with a second end connected at an elbow joint with a second end of the first arm to be rotatable, wherein said elbow joint is formed by a driving shaft connecting the second arm with the first arm, said elbow joint pivoting about said driving shaft, and wherein said second arm is bent;
   an arm driving part including a motor connected to the driving shaft for first introducing driving movement to the first and second arm at the driving shaft to cause pivoting of the elbow joint to allow the first arm and the second arm to be folded or unfolded and thus removes the state of singularity by rotating the second end of the second arm based on the second end of the first arm to allow the second arm to be unfolded with the first arm when a virtual linear line connecting both ends of the first arm and another virtual line connecting both ends of the second arm are arranged at an overlapped state while the first arm and the second arm move.

2. The apparatus of claim 1, wherein the second arm formed in a bent shape includes a first body part and a second body part;
   wherein a first end of the first body part is supported by the transferring unit to be rotatable, and a first end of the second body part is supported by a second end of the first arm to be rotatable while being rotated by the arm driving part; and
   wherein the length of the first body part is formed longer than that of the second body part.

3. The apparatus of claim 1, wherein the second arm formed in a bent shape includes a first body part and a second body part;
   wherein a first end of the first body part is supported by the transferring unit to be rotatable, and a first end of the second body part is supported by a second end of the first arm to be rotatable while being rotated by the arm driving part; and
   wherein the length of the first body part is formed shorter than, or equally to, that of the second body part.

4. The apparatus of claim 2, wherein the first body part and the second body part are formed with a shape of either straight line or arc.

* * * * *